United States Patent
Ha (10) Patent No.: US 6,718,357 B2
(45) Date of Patent: Apr. 6, 2004

(54) MICROCOMPUTER INCLUDING AN UPPER AND LOWER CLIP CIRCUIT

(75) Inventor: Sanghoon Ha, Hyogo (JP)

(73) Assignees: Renesas Technology Corp., Tokyo (JP); Mitsubishi Electric System LSI Design Corporation, Itami (JP)

( * ) Notice: Subject to any disclaimer, the term of this patent is extended or adjusted under 35 U.S.C. 154(b) by 418 days.

(21) Appl. No.: 09/755,107

(22) Filed: Jan. 8, 2001

(65) Prior Publication Data

US 2002/0026467 A1 Feb. 28, 2002

(30) Foreign Application Priority Data

Aug. 22, 2000 (JP) ........................................ 2000-251528

(51) Int. Cl.[7] .............................. G06F 7/38; G06F 15/00
(52) U.S. Cl. ........................................ 708/552; 708/207
(58) Field of Search ................................ 708/552, 207; 340/146.2

(56) References Cited

U.S. PATENT DOCUMENTS

| | | | | | |
|---|---|---|---|---|---|
| 4,379,338 A | * | 4/1983 | Nishitani et al. | ........... | 708/552 |
| 4,722,066 A | * | 1/1988 | Armer et al. | ................ | 708/552 |
| 4,817,047 A | * | 3/1989 | Nishitani et al. | ........... | 708/552 |
| 5,164,914 A | * | 11/1992 | Anderson | .................... | 708/552 |
| 5,508,951 A | * | 4/1996 | Ishikawa | ..................... | 708/552 |

FOREIGN PATENT DOCUMENTS

JP          10-333835          12/1998

* cited by examiner

*Primary Examiner*—Tan V. Mai
(74) *Attorney, Agent, or Firm*—Burns, Doane, Swecker & Mathis, L.L.P.

(57) ABSTRACT

A microcomputer is provided with an upper clip circuit for comparing digital values output from an analog-to-digital (AD) converting circuit 1 with a high level reference value A, and replacing a digital value larger than the reference value A with the reference value A; and a lower clip circuit for comparing digital values output from the upper clip circuit with a reference value B, and replacing a digital value smaller than the reference value B with the reference value B. Irregular signal waveforms can be removed by replacing the reference values A, B, thereby enhancing the reliability of operation results.

7 Claims, 6 Drawing Sheets

MICROCOMPUTER INCLUDING AN UPPER AND LOWER CLIP CIRCUIT

BACKGROUND OF THE INVENTION

1. Field of the Invention

The present invention relates to a microcomputer performing arithmetic processing (operating) based on AD (analog-to-digital) converted digital values.

2. Description of Related Art

Figure 6:
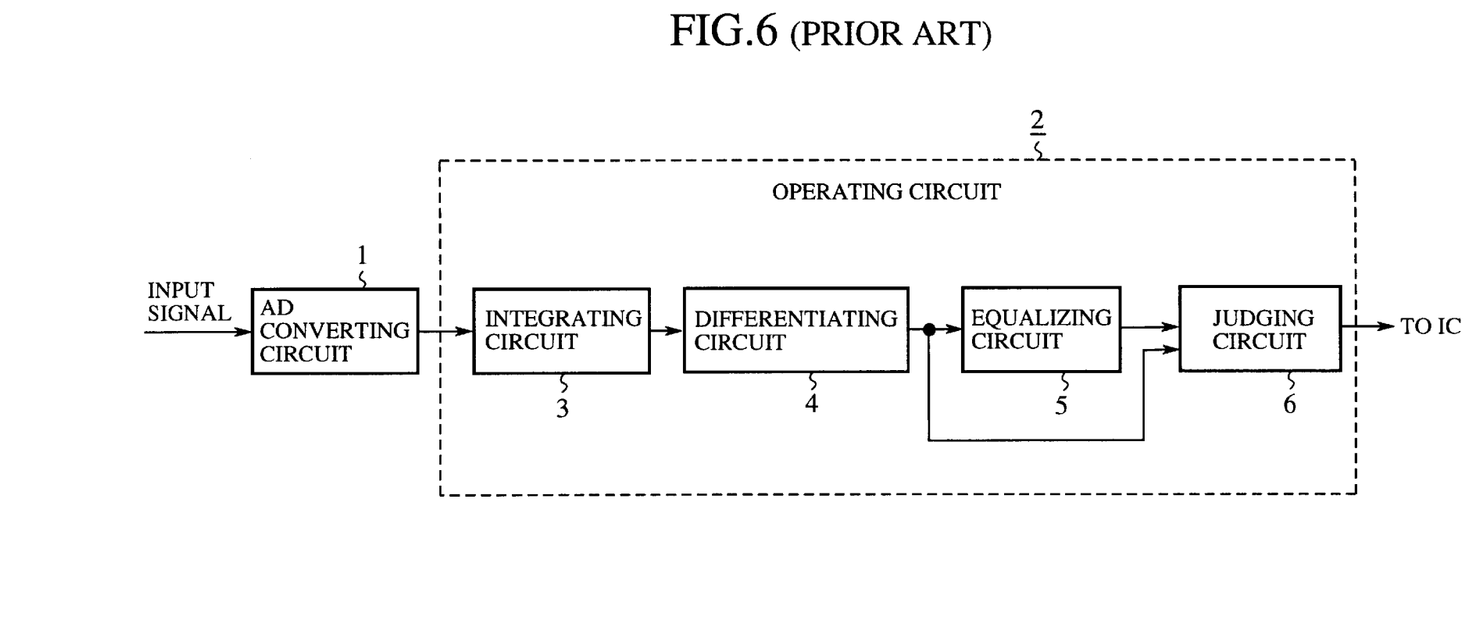
FIG. 6 is a block diagram showing a conventional microcomputer.

FIG. 6 is a block diagram showing a conventional microcomputer. In the figure, the reference numeral 1 designates an AD converting circuit which converts analog input signals to digital signals based on a certain sampling cycle; 2 designates an operating circuit which performs arithmetic processing based on the digital values; 3 designates an integrating circuit which integrates the digital values input from the AD converting circuit 1; 4 designates a differentiating circuit which differentiates the integrated digital values; 5 designates an equalizing circuit which equalizes the differentiated digital values to obtain a slice level; 6 designates a judging circuit which judges the differentiated digital values based on the slice level to output binary data.

Next, the operation of the conventional microcomputer will be described.

The AD converting circuit 1 performs a sampling operation of analog input signals based on a certain sampling cycle and quantizes them to directly output the quantized digital values to the operating circuit 2.

In the operating circuit 2, the integrating circuit 3 integrates the digital values and the differentiating circuit 4 then differentiates the integrated digital values. The equalizing circuit 5 equalizes the differentiated digital values to obtain a slice level and the judging circuit 6 compares and judges the digital values differentiated by the differentiating circuit 4 based on the slice level to output binary data, "0" and "1". The operation result by the operating circuit 2 is output to the later circuits of the microcomputer.

Since the conventional microcomputer is thus constructed, there is a subject that in cases where analog input signals supplied to the AD converting circuit 1 contains noise components such as an overshoot and an undershoot, digital values quantized by the AD converting circuit 1 contains irregular signal waveforms and a slice level determined by the equalizing circuit 5 changes, resulting in the occurrence of an error in binary data provided by the judging circuit 6.

SUMMARY OF THE INVENTION

The present invention is implemented to solve the above subject involved in the conventional microcomputer. An object of the present invention is to provide a microcomputer capable of outputting reliable operation results by removing irregular signal waveforms.

According to an aspect of the present invention, there is provided a microcomputer comprising; an AD converting circuit for AD converting analog input signals based on a certain sampling cycle; an upper clip circuit for comparing digital values output from the AD converting circuit with a high level reference value, and replacing a digital value larger than the high level reference value with the high level reference value; a lower clip circuit for comparing digital values output from the upper clip circuit with a low level reference value, and replacing a digital value smaller than the low level reference value with the low level reference value; and an operating circuit for performing arithmetic processing based on digital values output from the lower clip circuit.

Here, the microcomputer may further comprises; an error detecting circuit for detecting an error of an operation result by the operating circuit; and a level reference value operating unit for operating a renewal value of the high level reference value used in the upper clip circuit based on a mean value of digital values output from the AD converting circuit, a maximum value of digital values and the currently set high level reference value, and operating a renewal value of the low level reference value used in the lower clip circuit based on a mean value of digital values output from the AD converting circuit, a minimum value of digital values and the currently set low level reference value, in cases where the error detecting circuit detects an error of an operation result.

As stated above, a microcomputer of the present invention is constructed so as to comprise; an AD converting circuit for AD converting analog input signals based on a certain sampling cycle; an upper clip circuit for comparing digital values output from the AD converting circuit with a high level reference value, and replacing a digital value larger than the high level reference value with the high level reference value; a lower clip circuit for comparing digital values output from the upper clip circuit with a low level reference value, and replacing a digital value smaller than the low level reference value with the low level reference value; and an operating circuit for performing arithmetic processing based on digital values output from the lower clip circuit. Because of the construction, irregular signal waveforms caused by noise components contained in analog input signals can be removed by replacing with the high and low level reference values so that a microcomputer capable of outputting reliable operation results can be provided.

Further, a microcomputer of the present invention is constructed so as to comprise; an error detecting circuit for detecting an error of an operation result by the operating circuit; and a level reference value operating unit for operating a renewal value of the high level reference value used in the upper clip circuit based on a mean value of digital values output from the AD converting circuit, a maximum value of digital values and the currently set high level reference value, and operating a renewal value of the low level reference value used in the lower clip circuit based on a mean value of digital values output from the AD converting circuit, a minimum value of digital values and the currently set low level reference value, in cases where the error detecting circuit detects an error of an operation result. Because of the construction, in cases where the currently set high and low reference values become improper and the error detecting circuit detects an error of operation results, the level reference value operating unit can operate more proper high and low reference values to set them in the upper and lower clip circuits, thereby enhancing the reliability of operation results by the operating circuit.

DETAILED DESCRIPTION OF THE PREFERRED EMBODIMENTS

An embodiment of the invention will be described.
Embodiment 1

Figure 1:
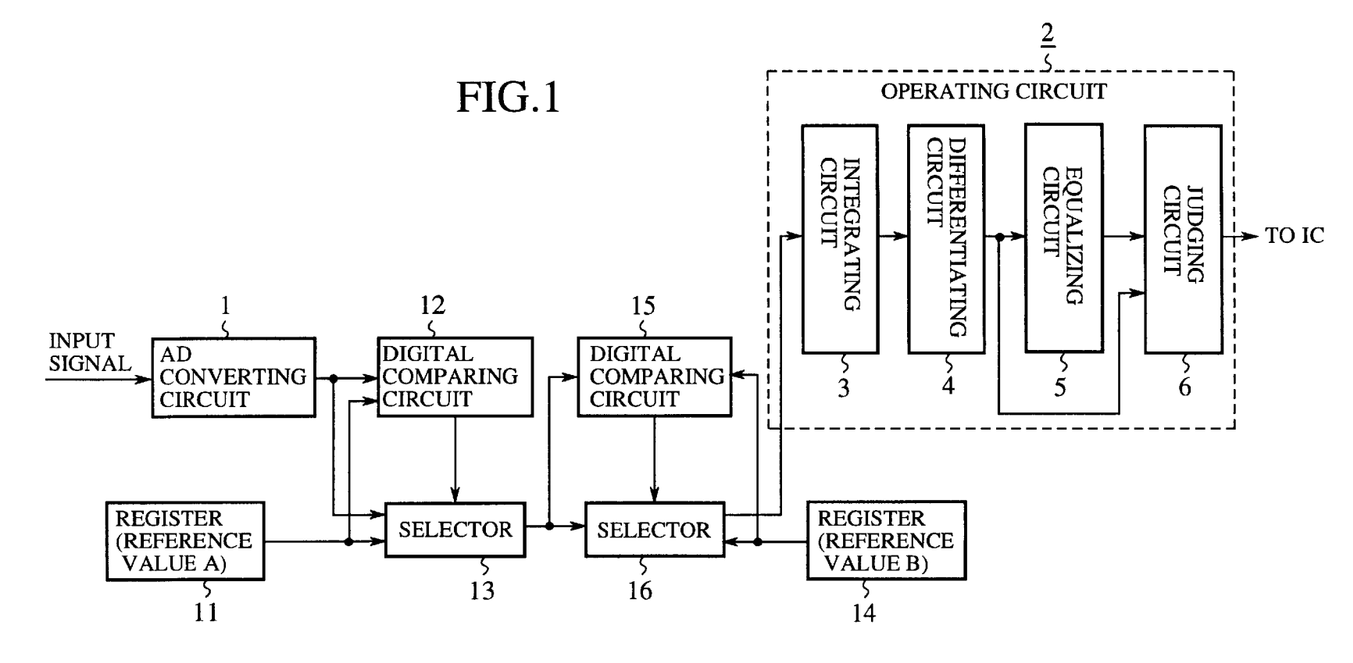
FIG. 1 is a block diagram showing a microcomputer according to the embodiment 1 of the present invention.

FIG. 1 is a block diagram showing a microcomputer according to the embodiment 1 of the present invention. In the figure, the reference numeral 1 designates an AD converting circuit which converts analog input signals to digital signals based on a certain sampling cycle.

The reference numeral 11 designates a register holding a reference value A (high level reference value); 12 designates a digital comparing circuit which compares a digital value output from the AD converting circuit 1 with the reference value A held in the register 11; 13 designates a selector which selects the digital value from the AD converting circuit 1 or the reference value A held in the register 11 in response to a selection signal from the digital comparing circuit 12; and the register 11, the digital comparing circuit 12 and the selector 13 constitutes an upper clip circuit. The reference numeral 14 designates a register holding a reference value B (low level reference value); 15 designates a digital comparing circuit which compares the digital value output from the selector 13 with the reference value B held in the register 14; 16 designates a selector which selects the digital value from the selector 13 or the reference value B held in the register 14 in response to a selection signal from the digital comparing circuit 15; and the register 14, the digital comparing circuit 15 and the selector 16 constitutes a lower clip circuit.

The reference numeral 2 designates an operating circuit which performs arithmetic processing based on digital values from the selector 16. In the operating circuit 2, the reference numeral 3 designates an integrating circuit which integrates digital values input from the selector 16; 4 designates a differentiating circuit which differentiates the integrated digital values; 5 designates an equalizing circuit which equalizes the differentiated digital values to obtain a slice level; 6 designates a judging circuit which judges the differentiated values based on the slice level to output binary data.

Next, the operation of the microcomputer will be described.

Figure 2:
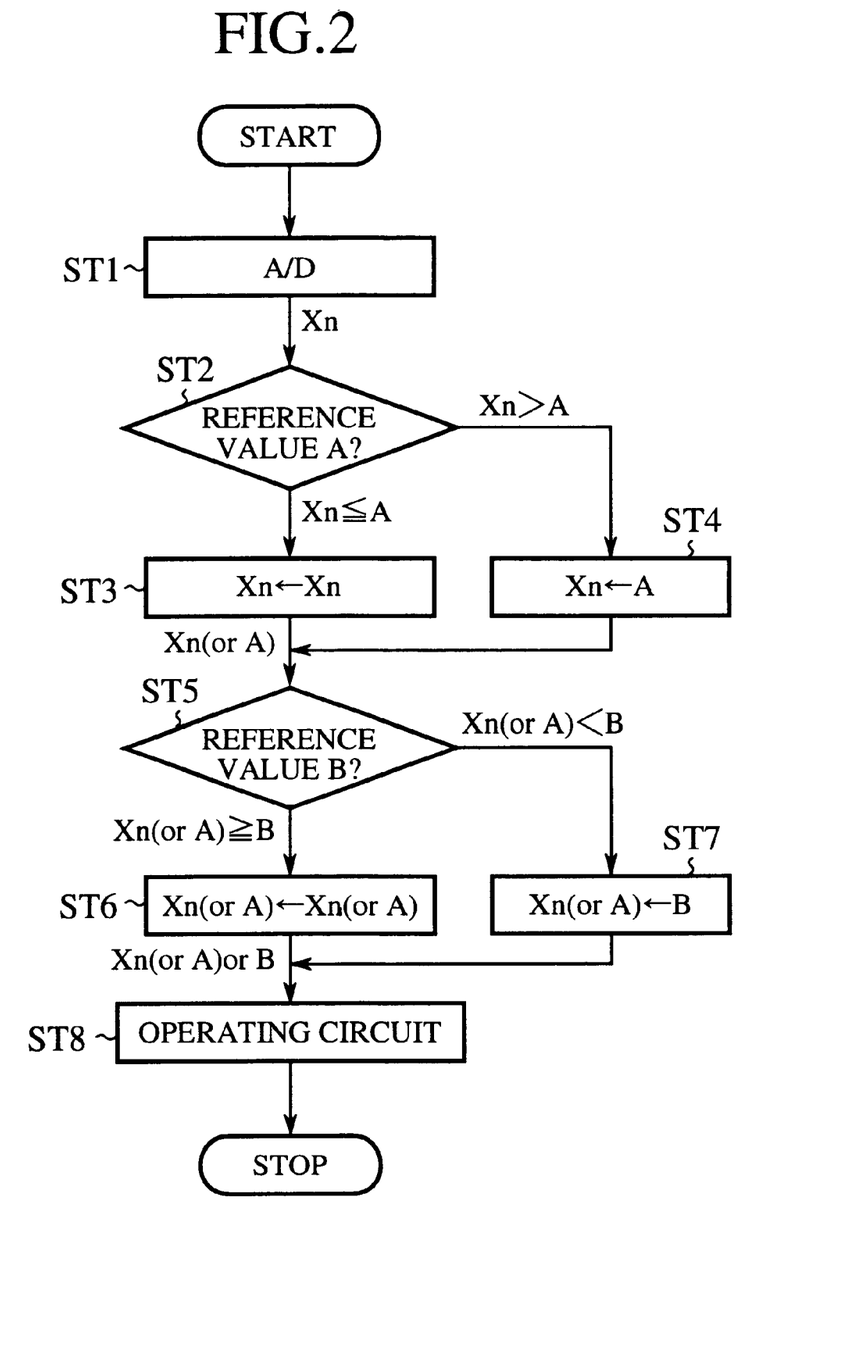
FIG. 2 is a flowchart showing the operation of the microcomputer according to the embodiment 1 of the present invention.

FIG. 2 is a flowchart showing the operation of the microcomputer according to the embodiment 2 of the present invention. FIGS. 3A to 3D are waveform charts showing waveforms of certain units of the microcomputer. The operation will be explained with reference to these figures.

Figure 3A:
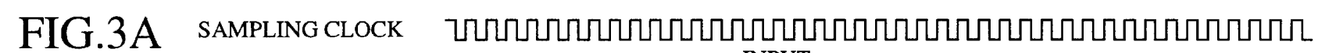
FIG. 3A is a waveform chart showing a waveform of sampling clocks.
Figures 3B, 3C:
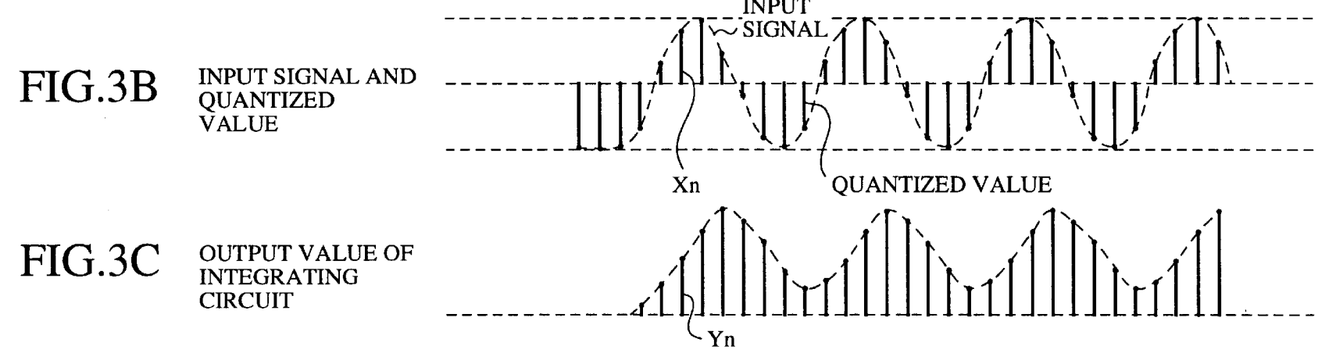
FIG. 3B is a waveform chart showing a waveform of analog input signals and quantized values.
FIG. 3C is a waveform chart showing a waveform of output values form an integrating circuit.

The AD converting circuit 1 performs a sampling operation of analog input signals based on a certain sampling cycle and quantized them to output the quantizied n-bit digital values $X_n$ to the digital comparing circuit 12 and the selector 13 (ST1 in FIG. 2). FIG. 3A shows sampling clocks supplied to the AD converting circuit 1; and FIG. 3B shows analog input signals input to the AD converting circuit 1 and n-bit digital values $X_n$ quantized by the AD converting circuit 1.

In cases where analog input signals contain noise components such as an overshoot and an undershoot, n-bit digital values $X_n$ quantized by the AD converting circuit 1 disadvantageously contains irregular signal waveforms.

In order to avoid the problem, the high level reference value A and the low level reference value B are set in the register 11 and the register 14, respectively, based on a predicted mean value and an amplitude of the analog input signals. In cases where a n-bit digital value $X_n$ is larger than the reference value A or smaller than the reference value B, it is replaced with the reference value A or the reference value B by the upper clip circuit or the lower clip circuit to remove the irregular signal waveforms. This operation will be described in detail below.

The digital comparing circuit 12 compares a n-bit digital value $X_n$ output from the AD converting circuit 1 with the reference value A held in the register 11 and judges whether or not the n-bit digital value $X_n$ is larger than the reference value A to output a selection signal based on the judgement result to the selector 13 (ST2 in FIG. 2). If the n-bit digital value $X_n$ is not larger than the reference value A, the selector 13 selects and outputs the n-bit digital value $X_n$ supplied from the AD converting circuit 1 in response to the selection signal from the digital comparing circuit 12 (ST3 in FIG. 2). On the other hand, if the n-bit digital value $X_n$ is larger than the reference value A, the selector 13 selects and outputs the reference value A held in the register 11 in response to the selection signal from the digital comparing circuit 12 (ST4 in FIG. 2). Thus, in cases where a n-bit digital value $X_n$ from the AD converting circuit 1 is larger than the reference value A because of containing a noise component such as an overshoot, it is replaced with the reference value A.

The digital comparing circuit 15 compares the n-bit digital value $X_n$ output from the selector 13 with the reference value B held in the register 14 and judges whether or not the n-bit digital value $X_n$ is smaller than the reference value B to output a selection signal based on the judgement result to the selector 16 (ST5 in FIG. 2). If the n-bit digital value $X_n$ is not smaller than the reference value B, the selector 16 selects and outputs the n-bit digital value $X_n$ supplied from the selector 13 in response to the selection signal from the digital comparing circuit 15 (ST6 in FIG. 2). On the other hand, if the n-bit digital value $X_n$ is smaller than the reference value B, the selector 16 selects and outputs the reference value B held in the register 14 in response to the selection signal from the digital comparing circuit 15 (ST7 in FIG. 2). Thus, in cases where a n-bit digital value $X_n$ from the AD converting circuit 1 is smaller than the reference value B because of containing a noise component such as an undershoot, it is replaced with the reference value B.

In the operating circuit 2, the integrating circuit 3 integrates n-bit digital values $X_n$ according to the logic of the following expression (1) to produce output values $Y_n$. FIG. 3C shows the output values $Y_n$ of the integrating circuit 3.

$$Y_n=(X_n+X_{n+1}+X_{n+2}+X_{n+3})/4 \tag{1}$$

Figure 3D:
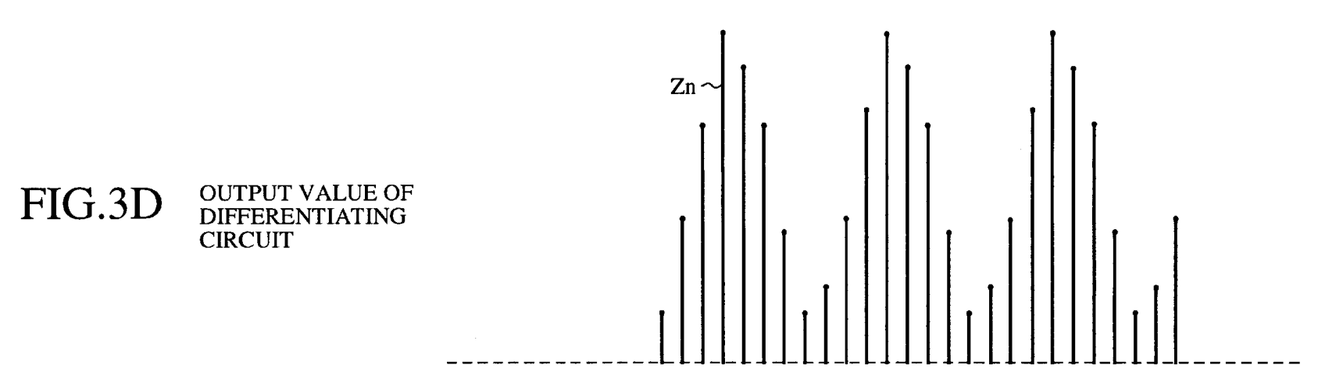
FIG. 3D is a waveform chart showing a waveform of output values from a differentiating circuit.

Further, the differentiating circuit 4 differentiates the output values $Y_n$ according to the logic of the following expression (2) to produce output values $Z_n$. FIG. 3D shows the output values $Z_n$ of the differentiating circuit 4.

$$Z_n=áY_n+(Y_n-Y_{n-1})+(Y_n-Y_{n+1}) \tag{2}$$

wherein á is a constant.

The equalizing circuit 5 equalizes the differentiated output values $Z_n$ to obtain a slice level and the judging circuit 6 compares and judges the digital values differentiated by the differentiating circuit 4 based on the slice level to output binary data of "0" and "1" (ST8 in FIG. 2). The operation result by the operating circuit 2 is output to the later circuits in the microcomputer.

As stated above, according to the embodiment 1 of the present invention, even if analog input signals supplied to the AD converting circuit 1 contain noise components such as an overshoot and an undershoot, the overshoots and the undershoots are replaced with the reference values A, B by the upper clip circuit and the lower clip circuit to remove irregular waveforms, thereby allowing reliable operation results to be output from the operating circuit 2.

In addition, although the reference values A, B are set in the registers 11, 14 in the embodiment 1, optimum reference values A, B for properly removing noise components without any influence on normal input signals may be optionally set depending on the magnitude of analog input signals supplied to the AD converting circuit 1 or the magnitude of noise components contained therein.

Embodiment 2

Figure 4:
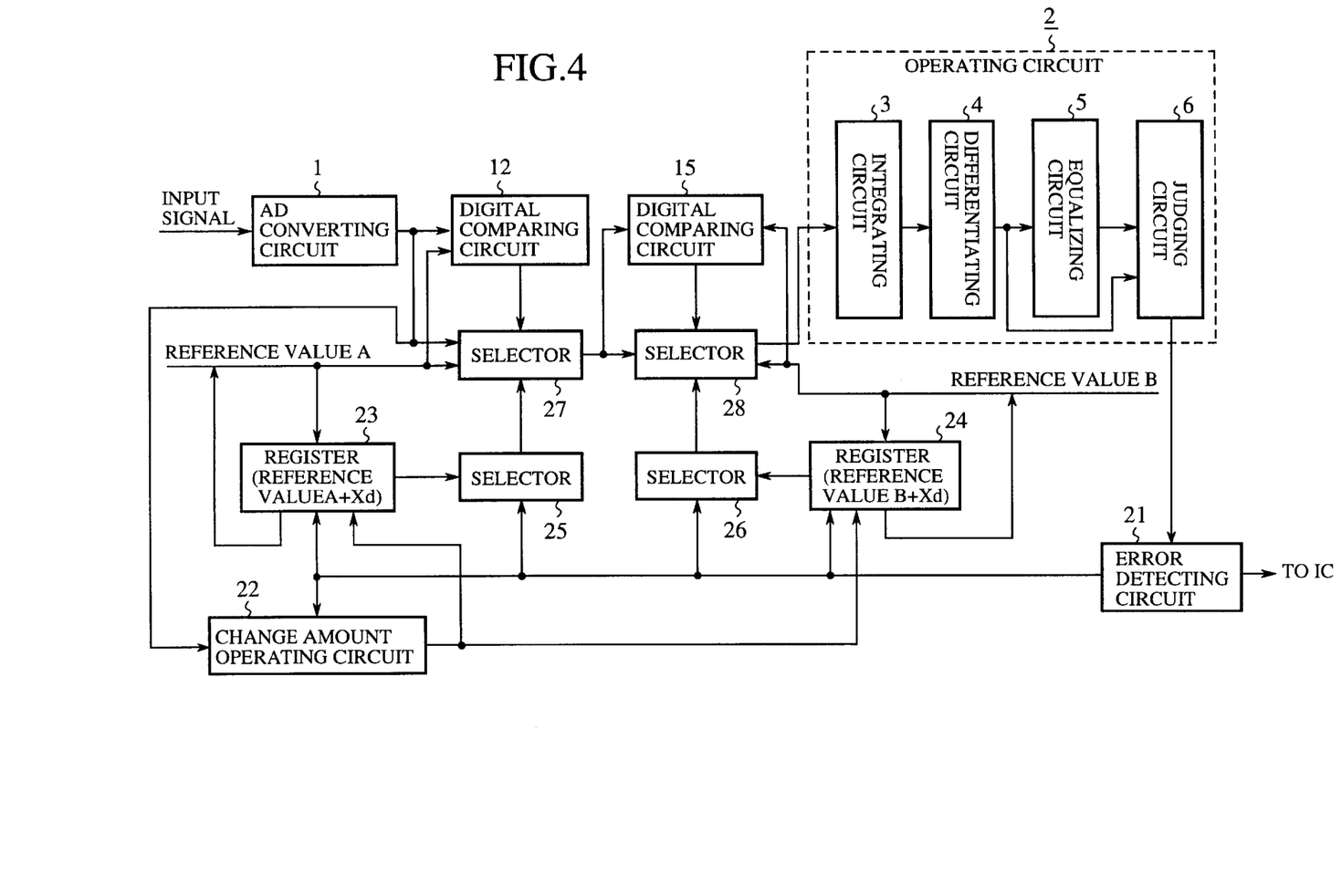
FIG. 4 is a block diagram showing a microcomputer according to the embodiment 2 of the present invention.

FIG. 4 is a block diagram showing a microcomputer according to the embodiment 2 of the present invention. In this figure, the reference numeral 21 designates an error detecting circuit, composed of a 8/4 hamming decoder and the like, which detects an error of binary data output from a judging circuit 6.

The reference numeral 22 designates a change amount operating unit (level reference value operating unit), composed of an arithmetic processing unit by software, which operates a renewal value of a reference value A based on the mean value of digital values output from an AD converting circuit 1, the mean value of maximum values of digital values and the currently set reference value A, and operates a renewal value of a reference value B based on the mean value of digital values output from the AD converting circuit 1, the mean value of minimum values of digital values and the currently set reference value B.

The reference numeral 23 designates a register holding a renewal reference value $A+X_d$; 24 designates a register holding a renewal reference value $B+X_d$; 25 designates a selector which supplies the renewal reference value $A+X_d$ held in the register 23 to a selector 27 in response to an error detection signal from the error detecting circuit 21; and 26 designates a selector which supplies the renewal reference value $B+X_d$ held in the register 24 to a selector 28 in response to an error detection signal from the error detecting circuit 21. The reference numeral 27 designates a selector which selects a digital value supplied from an AD converting circuit 1 or the renewal reference value $A+X_d$ supplied from the selector 25 in response to a selection signal from a digital comparing circuit 12, and constitutes an upper clip circuit. The reference numeral 28 designates a selector which selects the digital value supplied from the selector 27 or the renewal reference value $B+X_d$ supplied from the selector 26 in response to a selection signal from a digital comparing circuit 15, and constitutes a lower clip circuit.

The other construction is the same as that of FIG. 1.

Next, the operation of the microcomputer will be described.

Figure 5:
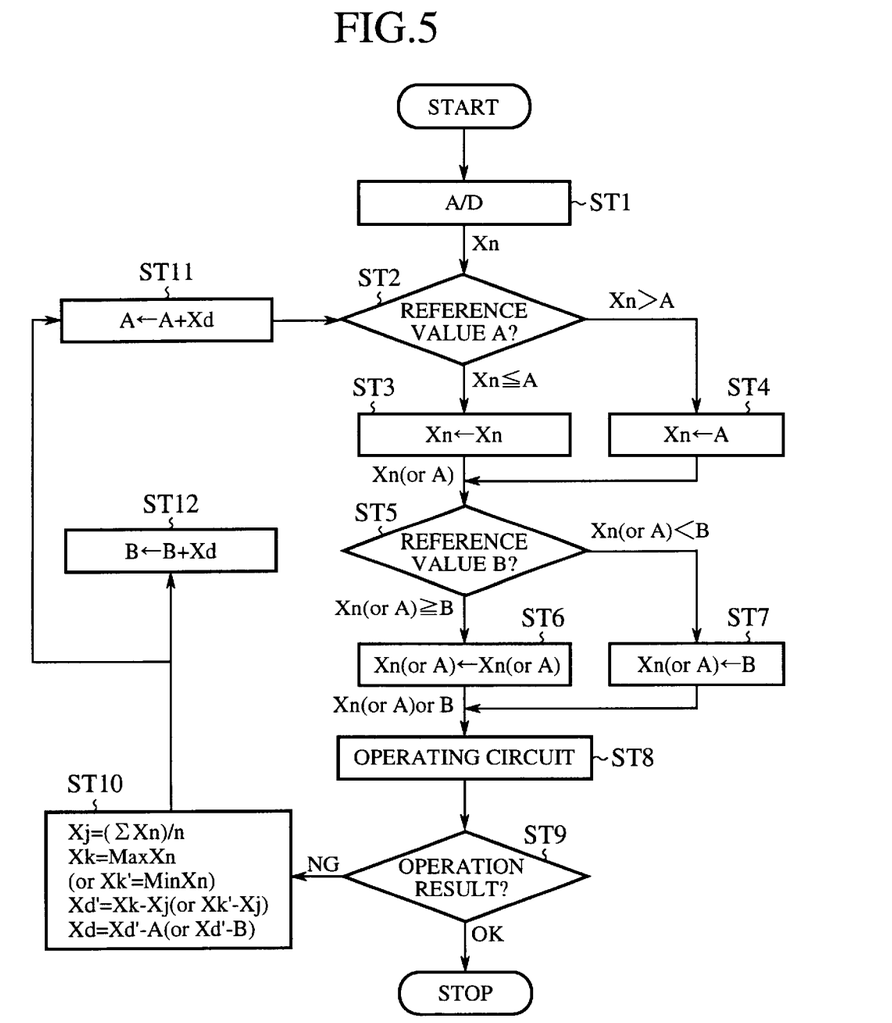
FIG. 5 is a flowchart showing the operation of the microcomputer according to the embodiment 2 of the present invention.

FIG. 5 is a flowchart showing the operation of the microcomputer according to the embodiment 2 of the present invention. The operation will be explained with reference to FIGS. 4 and 5.

First, the processing from the step of AD conversion by the AD converting circuit 1 (ST1 in FIG. 5) to the step of judging and outputting binary data by the judging circuit 6 (ST8 in FIG. 5) is the same as that of the embodiment 1.

The error detection circuit 21 is composed of a 8/4 hamming decoder and the like and detects an error of binary data from the judging circuit 6 (ST9 in FIG. 5). If any error is not detected, normal processing is repeated.

The change amount operating unit 22 operates the mean value $X_j$ of n-bit digital values $X_n$ output from the AD converting circuit 1 according to the logic of the following expression (3) in response to an error detection signal from the error detecting circuit 21.

$$X_j = (X_{n+1} + X_{n+2} + X_{n+3} + \ldots + X_{n+m} + X_{n+n})/n \quad (3)$$

Further, the change amount operating unit 22 operates the mean value $X_k$ of maximum values of n-bit digital values $X_n$ and then operates the difference $X_d'$ between the mean value $X_k$ of maximum values of n-bit digital values $X_n$ and the mean value $X_j$ of n-bit digital values $X_n$ according to the logic of following expression (4).

$$X_d' = X_k - X_j \quad (4)$$

On the other hand, the change amount operating circuit 22 operates a change amount $X_d$ of the reference value A based on the currently set reference value A according to the logic of following expression (5).

$$X_d = X_d' - A \quad (5)$$

Further, the change amount operating circuit 22 operates a change amount $X_d$ of the reference value B according to the logic of following expressions (6) and (7) in a similar way.

$$X_d' = X_k' - X_j \quad (6)$$

wherein $X_k'$ is the mean value of minimum values of n-bit digital values $X_n$.

$$X_d = X_d' - B \quad (7)$$

As stated above, the change amount operating circuit 22 operates the change amount $X_d$ of the reference values A, B based on changes in irregular waveform (ST10 in FIG. 5).

The change amount operating circuit 22 supplies the change amount $X_d$ of the reference value A thus operated to the register 23 and the change amount $X_d$ of the reference value B thus operated to the register 24. The register 23 holds the renewal reference value $A+X_d$ obtained by adding the change amount $X_d$ of the reference value A to the currently set reference value A, while the register 24 holds the renewal reference value $B+X_d$ obtained by adding the change amount $X_d$ of the reference value B to the currently set reference value B (ST1, ST12 in FIG. 5).

Further, the selector 25 supplies the renewal reference value $A+X_d$ held in the register 23 to the selector 27 in response to an error detection signal by the error detecting circuit 21, while the selector 26 supplies the renewal reference value $B+X_d$ held in the register 24 to the selector 28.

Thereafter, the digital comparing circuit 12 compares a n-bit digital value $X_n$ supplied from the AD converting circuit 1 with the renewal reference value $A+X_d$ held in the register 23, judges whether or not the n-bit digital value $X_n$ is larger than the renewal reference value $A+X_d$ and then outputs a selection signal based on the judgement result to the selector 27 (ST2 in FIG. 5). The selector 27 selects the n-bit digital value $X_n$ supplied from the AD converting circuit 1 or the renewal reference value $A+X_d$ supplied from the selector 25 in response to the selection signal from the digital comparing circuit 12.

The digital comparing circuit 15 compares the n-bit digital value $X_n$ supplied from the selector 27 with the renewal reference value $B+X_d$ held in the register 24, judges whether or not the n-bit digital value $X_n$ is smaller than the renewal reference value $B+X_d$ and then outputs a selection signal based on the judgement result to the selector 28 (ST5 in FIG. 5). The selector 28 selects the n-bit digital value $X_n$ supplied from the selector 27 or the renewal reference value $B+X_d$ supplied from the selector 26 in response to the selection signal from the digital comparing circuit 15.

Consequently, when errors are removed from operation results of the operating circuit 2, the error detecting circuit 21 does not output an error detection signal. On the other hand, when the currently set reference values A, B become improper as noise components contained in analog input signals change, the error detecting circuit 21 outputs an error detection signal so that the change amount operating circuit 22 operates a proper change amount $X_d$ of the reference values A, B again.

As stated above, according to the embodiment 2, even in cases where the currently set reference values A, B become improper due to changes in noise component contained in analog input signals, if the error detecting circuit 21 detects an error of operation results, the change amount operating circuit 22 operates a more proper change amount $X_d$ of the reference values A, B to renew the reference values A, B of the upper and lower clip circuits to the optimum values, thereby enhancing the reliability of operation results by the operating circuit 2.

What is claimed is:

1. A microcomputer comprising:

an analog-to-digital (AD) converting circuit for AD converting analog input signals based on a certain sampling cycle;

an upper clip circuit for comparing digital values output from the AD converting circuit with a high level reference value, and replacing a digital value larger than the high level reference value with the high level reference value;

a lower clip circuit for comparing digital values output from the upper clip circuit with a low level reference value, and replacing a digital value smaller than the low level reference value with the low level reference value; and an operating circuit for performing arithmetic processing based on digital values output from the lower clip circuit.

2. A microcomputer according to claim 1, further comprising:

an error detecting circuit for detecting an error of an operation result by the operating circuit; and a level reference value operating unit for operating a renewal value of the high level reference value used in the upper clip circuit based on a mean value of digital values output from the AD converting circuit, a maximum value of digital values and the currently set high level reference value, and operating a renewal value of the low level reference value used in the lower clip circuit based on a mean value of digital values output from the AD converting circuit, a minimum value of digital values and the currently set low level reference value, in cases where the error detecting circuit detects an error of an operation result.

3. A microcomputer according to claim 2, wherein said error detecting circuit comprises a 8/4 hamming decoder.

4. A microcomputer according to claim 1, wherein said upper clip circuit comprises:

a register for storing an high level reference value;

a digital comparing circuit connected to said register for comparing a digital value output from said AD converting circuit with said high level reference value and outputting a selection signal indicating a larger value of the compared values; and a selector connected to said register and said digital comparing circuit for selecting either the digital value from said AD converting circuit or said high level reference value in response to said selection signal output from said digital comparing circuit.

5. A microcomputer according to claim 1, wherein said lower clip circuit comprises:

a register for storing a low level reference value;

a digital comparing circuit connected to said register for comparing a digital value output from said AD converting circuit with said low level reference value and outputting a selection signal indicating a smaller value of the compared values; and a selector connected to said register and said digital comparing circuit for selecting either the digital value from said AD converting circuit or said low level reference value in response to said selection signal output from said digital comparing circuit.

6. A microcomputer according to claim 1, wherein said high level reference value is determined based on a predicted mean value and an amplitude of the analog input values.

7. A microcomputer according to claim 1, wherein said low level reference value is determined based on a predicted mean value and an amplitude of the analog input values.

* * * * *